United States Patent
Ohmi et al.

(10) Patent No.: US 7,202,534 B2
(45) Date of Patent: Apr. 10, 2007

(54) COMPLEMENTARY MIS DEVICE

(75) Inventors: Tadahiro Ohmi, c/o Management of Science & Technology Graduate School of Engineering Tohoku University, 05, Aza-Aoba, Aramaki, Aoba-Ku, Sendai-Shi, Miyagi 980-8579 (JP); Koji Kotani, Sendai (JP); Shigetoshi Sugawa, Sendai (JP)

(73) Assignees: Tadahiro Ohmi (JP); Tokyo Electron Limited (JP)

( * ) Notice: Subject to any disclaimer, the term of this patent is extended or adjusted under 35 U.S.C. 154(b) by 203 days.

(21) Appl. No.: 10/467,797

(22) PCT Filed: Dec. 10, 2002

(86) PCT No.: PCT/JP02/12925

§ 371 (c)(1),
(2), (4) Date: Jun. 13, 2004

(87) PCT Pub. No.: WO03/054962

PCT Pub. Date: Jul. 3, 2003

(65) Prior Publication Data

US 2004/0245579 A1    Dec. 9, 2004

(30) Foreign Application Priority Data

Dec. 13, 2001 (JP) ............................ 2001-380534

(51) Int. Cl.
*H01L 29/76* (2006.01)
(52) U.S. Cl. ..................................... 257/369; 257/401
(58) Field of Classification Search ............... 257/255, 257/369, 401, 627; 438/198, 199
See application file for complete search history.

(56) References Cited

U.S. PATENT DOCUMENTS

| 3,461,361 | A | * | 8/1969 | Delivorias ................. 257/369 |
| 3,476,991 | A |   | 11/1969 | Mize et al. |
| 3,603,848 | A | * | 9/1971 | Sato et al. .................. 257/255 |
| 4,768,076 | A | * | 8/1988 | Aoki et al. .................... 257/70 |
| 5,317,175 | A | * | 5/1994 | Throngnumchai .......... 257/255 |
| 5,384,473 | A | * | 1/1995 | Yoshikawa et al. ......... 257/255 |
| 5,391,506 | A |   | 2/1995 | Tada et al. |
| 6,657,259 | B2 | * | 12/2003 | Fried et al. ................. 257/350 |
| 2004/0245579 | A1 | * | 12/2004 | Ohmi et al. ................ 257/376 |

FOREIGN PATENT DOCUMENTS

EP        0 261 666        3/1988

(Continued)

OTHER PUBLICATIONS

European Official Action issued Dec. 14, 2005, in counterpart European application, pp. 1-3, The Hague.

*Primary Examiner*—Mark V. Prenty
(74) *Attorney, Agent, or Firm*—Finnegan, Henderson, Farabow, Garrett & Dunner, LLP

(57) ABSTRACT

A CMOS device includes a p-channel MOS transistor and an n-channel MOS transistor having a structure formed on a (100) surface of a silicon substrate and having a different crystal surface, a high-quality gate insulation film formed on such a structure by a microwave plasma process, and a gate electrode formed thereon, wherein the size and the shape of the foregoing structure is set such that the carrier mobility is balanced between the p-channel MOS transistor and the n-channel MOS transistor.

8 Claims, 15 Drawing Sheets

FOREIGN PATENT DOCUMENTS

| | | |
|---|---|---|
| JP | 57-166071 | 10/1982 |
| JP | 59-132646 | 7/1984 |
| JP | 61-069165 | 4/1986 |
| JP | 63-131565 | 6/1988 |
| JP | 04256369 A | 9/1992 |
| JP | 05110083 A | 4/1993 |

* cited by examiner $W_1 \cong 3W_2$

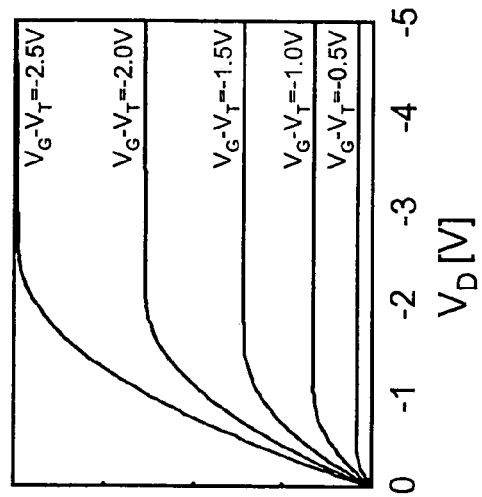
FIG.5A (100)
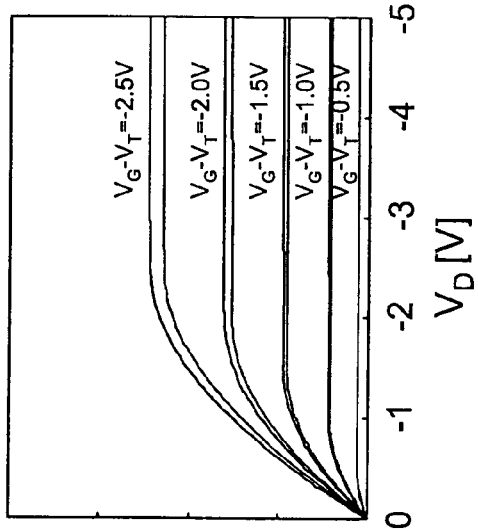
FIG.5B (111)
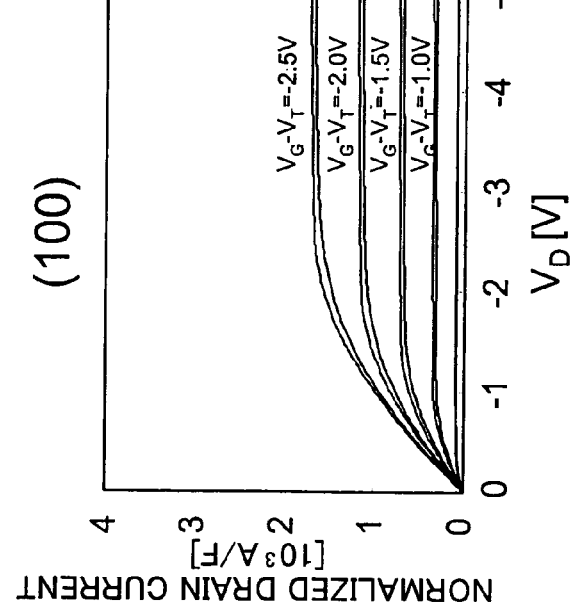
FIG.5C (110)

COMPLEMENTARY MIS DEVICE

TECHNICAL FIELD

The present invention generally relates to semiconductor devices and more particularly to a complementary MIS device in which the carrier mobility is balanced between a p-channel MOS transistor and an n-channel MOS transistor.

BACKGROUND ART

A CMOS circuit is a fundamental electronic circuit that includes a p-channel MOS transistor and an n-channel MOS transistor. Thus, CMOS devices constituting such a CMOS circuit are used extensively in various electronic apparatuses.

Conventionally, a CMOS device has been formed on a (100) surface of a Si substrate, on which it is possible to form a high-quality thermal oxide film.

On the (100) surface of a Si substrate, on the other hand, there appears a significant difference in the effective mass and lattice scattering probability between the electrons and holes, and because of this, the electron mobility takes a value twice or three times as large as that of the hole mobility.

FIG. 1 shows the circuit of a typical CMOS inverter 10.

Referring to FIG. 1, the CMOS inverter 10 is formed of a p-channel MOS transistor 11 and an n-channel MOS transistor connected in series, and an input signal is supplied commonly to the p-channel MOS transistor and the n-channel MOS transistor.

In such a CMOS inverter 10, the hole mobility of the p-channel MOS transistor, and hence the current drivability, can have a value of only ½–⅓ of the electron mobility of the n-channel MOS transistor as explained before. Thus, in order to realize sufficient current drivability and operational speed for the CMOS device as a whole, it has been necessary in conventional CMOS inverters to set a channel width $W_1$ of the p-channel MOS transistor 11 to be 2–3 times as large as a channel width $W_2$ of the n-channel MOS transistor.

However, there arises various difficulties when using of such a conventional CMOS device construction due to the fact that the area of the channel region of the p-channel MOS transistor becomes larger than the area of the channel region of the n-channel MOS transistor, in that it becomes necessary to array the devices of different sizes at the time of designing highly miniaturized high-speed integrated circuits. Further, there arises a problem of increased parasitic capacitance in the p-channel MOS transistor having a large area, while such an increase of parasitic capacitance causes the problem of degradation of operational speed and increase of power consumption.

Further, it should be noted that such a CMOS circuit shows non-linear operational characteristics due to the asymmetry of characteristics between the p-channel MOS transistor and the n-channel MOS transistor, while the existence of such an asymmetric characteristics imposes a limitation when the CMOS circuit is to be applied to analog circuits, and the like, in which a linear operation is required.

As explained before, conventional semiconductor devices, including CMOS circuits, have been formed on the (100) surface of a Si substrate. On the other hand, it should be noted the (100) surface of a silicon crystal has the character of low atomic density and easily undergoes cracking. Thus, there has been a difficulty in handling a wafer particularly in the case the diameter of the wafer is increased.

DISCLOSURE OF THE INVENTION

Accordingly, it is a general object of the present invention to provide a novel and useful semiconductor device and fabrication process thereof wherein the foregoing problems are eliminated.

Another and more specific object of the present invention is to provide a CMOS semiconductor device in which current drivability is balanced between a p-channel MOS transistor and an n-channel MOS transistor.

Another object of the present invention is to provide a complementary MIS device, characterized by:

a semiconductor substrate having a first crystal surface as a principal surface, said semiconductor substrate being defined with a p-channel MIS transistor region and an n-channel MIS transistor region;

a p-channel MIS transistor comprising: a first semiconductor structure formed in said p-channel MIS transistor region as a part of said semiconductor substrate and formed of a pair of sidewall surfaces defined by a second crystal surface different from said first crystal surface and a top surface defined by a third crystal surface different from said second crystal surface; a first gate insulation film formed on said p-channel MIS transistor region so as to cover said principal surface and said sidewall surfaces and said top surface of said first semiconductor structure with a substantially uniform thickness; a first gate electrode formed on said p-channel MIS transistor region so as to cover said principal surface and said sidewall surface and said top surface of said first semiconductor structure continuously via said first gate insulation film; and first and second p-type diffusion regions formed in said semiconductor substrate and said first semiconductor structure in said p-channel MIS transistor region at a first side and an opposite side of said first gate electrode, each of said first and second p-type diffusion regions extending continuously along said principal surface of said semiconductor substrate and said sidewall surfaces and said top surface of said first semiconductor structure;

an n-channel MIS transistor comprising: a second semiconductor structure formed in said n-channel MIS transistor region as a part of said semiconductor substrate and formed of a pair of sidewall surfaces defined by a fourth crystal surface different from said first crystal surface and a top surface defined by a fifth crystal surface different from said fourth crystal surface; a second gate insulation film formed on said n-channel MIS transistor region so as to cover said principal surface and said sidewall surfaces and said top surface of said second semiconductor structure with a substantially uniform thickness; a second gate electrode formed on said n-channel MIS transistor region so as to cover said principal surface and said sidewall surface and said top surface of said second semiconductor structure continuously via said second gate insulation film; and first and second n-type diffusion regions formed in said semiconductor substrate and said second semiconductor structure in said n-channel MIS transistor region at a first side and an opposite side of said second gate electrode, each of said first and second n-type diffusion regions extending continuously along said principal surface of said semiconductor substrate and said sidewall surface and said top surface of said second semiconductor structure;

a width of said top surface and said sidewall surfaces of said first semiconductor structure and a width of said top surface and said sidewall surfaces of said second semiconductor structure being set such that a current drivability of said p-channel MIS transistor balances substantially with a current drivability of said n-channel MIS transistor.

Another object of the present invention is to provide a complementary MIS device characterized by:

a semiconductor substrate having a principal surface of a surface crystal orientation;

an n-channel MIS transistor comprising: a first gate electrode formed on a principal surface of said semiconductor substrate via a first gate insulation film with a first crystal orientation; and first and second n-type diffusion regions formed in said semiconductor substrate at a first side and an opposite side of said first gate electrode; and a p-channel MIS transistor comprising: a second gate electrode formed on the principal surface of said semiconductor substrate via a second gate insulation film with a second crystal orientation; and first and second p-type diffusion regions formed in said semiconductor substrate at a first side and an opposite side of said second gate electrode, said first gate electrode and said second gate electrode being commonly connected, said second p-type diffusion region and said first n-type diffusion region being commonly connected, said first crystal orientation and said second crystal orientation being set such that a current drivability of said p-channel MIS transistor balances a current drivability of said n-channel MIS transistor.

According to the present invention, it becomes possible to balance the current drivability between a p-channel MOS transistor and an n-channel MOS transistor by using a crystal surface other than (100) surface of silicon.

BRIEF DESCRIPTION OF THE DRAWINGS

FIGS. 5A–5C are diagrams showing the drain current characteristics of p-channel MOS transistors formed on various crystal surfaces;

BEST MODE FOR IMPLEMENTING THE INVENTION

[Principle]

Figure 1:
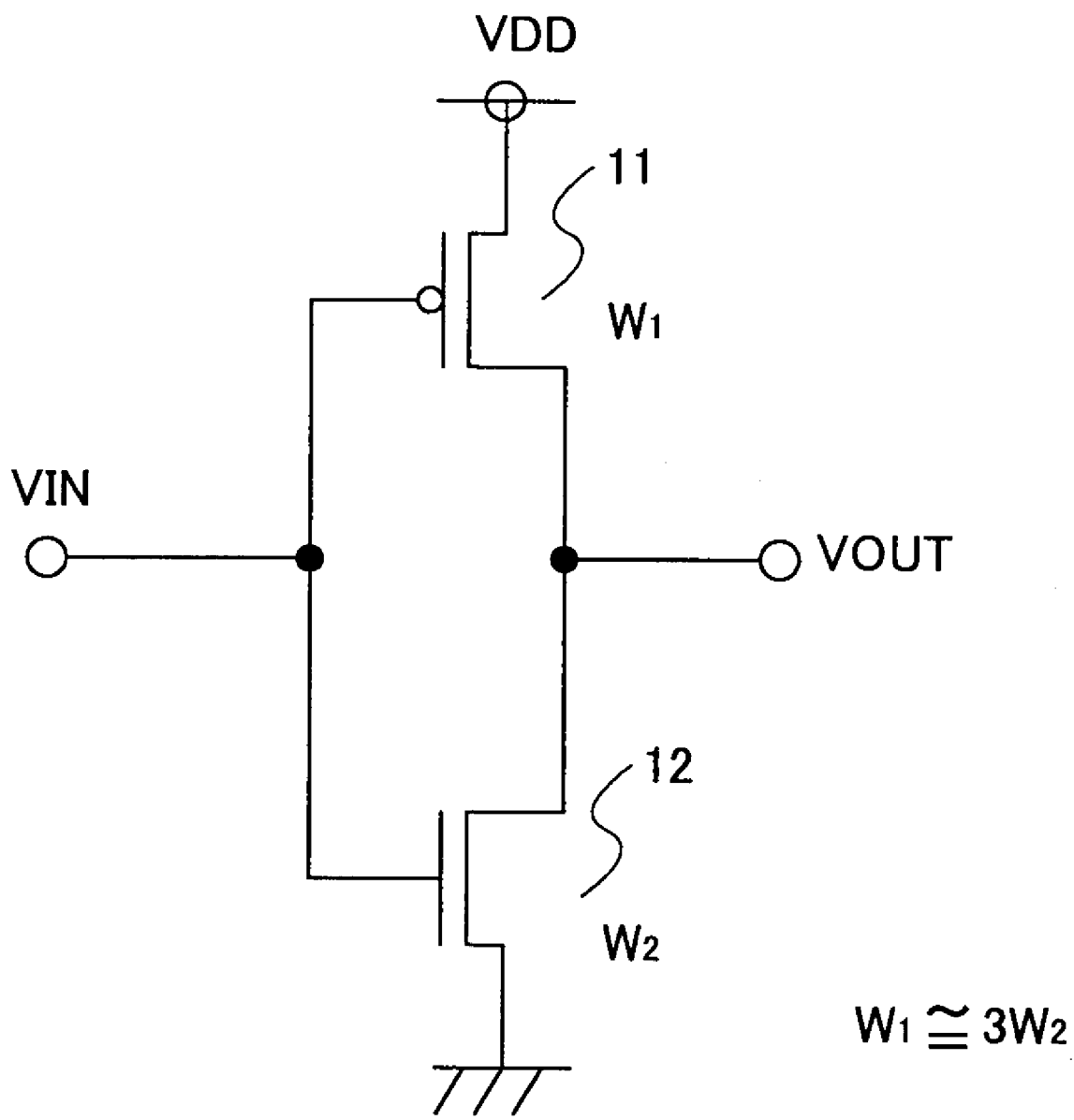
FIG. 1 is an equivalent circuit diagram of a conventional CMOS device.
Figure 2:
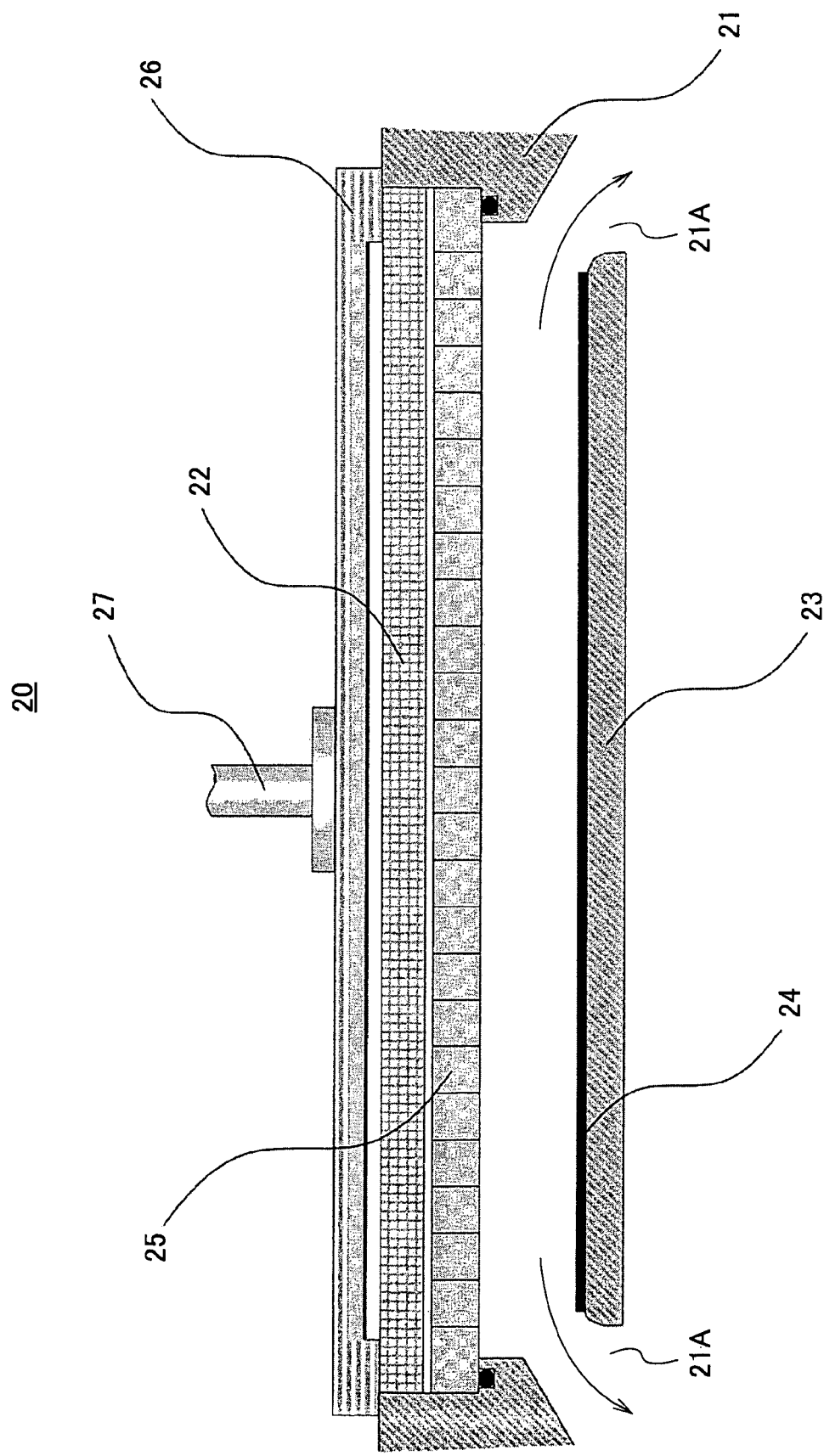
FIG. 2 is a diagram showing the construction of a substrate processing apparatus used in the present invention.

FIG. 2 shows the construction of a microwave substrate processing apparatus 20 used in the present invention for formation of a gate insulation film.

Referring to FIG. 2, the microwave substrate processing apparatus 20 has a processing vessel 21 evacuated at an evacuation port 21A and a stage 23 is provided in the processing vessel 21 for holding a substrate 24 to be processed. The evacuation port 21A is formed so as to surround the periphery of the stage 23 and excessive radicals or byproducts associating with the substrate processing are exhausted from a process space in the vicinity of the surface of the substrate 24 to the outside of the apparatus uniformly along the substrate surface.

Further, the processing vessel 21 is provided with a flat microwave window 22 of typically $Al_2O_3$ or quartz as a part of the chamber wall such that the microwave window 22 faces the substrate 24. Further, there is formed a flat shower plate 25 at the inner side of the microwave window 22 so as to face the substrate 24, wherein the shower plate 25 is used to supply a process gas uniformly.

Further, at the outer side of the processing vessel 21, there is provided a microwave antenna 26 such as a radial line slot antenna 26 fed with microwave via a coaxial waveguide 27 in connection with the microwave window 22, and there is formed high-density but low-energy plasma right underneath the showerhead plate as a result of driving the microwave antenna 26 with a microwave having a frequency of 900 MHz–10 GHz, typically 2.45 GHz.

It should be noted that the microwave substrate processing apparatus 20 of FIG. 2 induces excitation in the process gas supplied from the shower plate 25 with the plasma, and the surface of the substrate 24 undergoes processing by the radicals formed as a result of such an excitation.

More specifically, the interior of the processing vessel 21 is evacuated at first to a highly vacuum state, and a mixed gas of Kr and $O_2$ is introduced subsequently into the interior of the processing vessel 21 from the shower plate 25. Thereby, the internal pressure of the processing vessel 21 is set to about 1 Torr (about 133 Pa). Further, the temperature of the substrate 24 is set to 200–550° C., preferably 400° C., and high-density plasma is formed uniformly in the vicinity of the surface of the substrate 24 by supplying a microwave to the foregoing microwave antenna.

As a result of plasma formation, Kr undergoes excitation to an intermediate excitation state, and there is caused efficient formation of atomic state oxygen O* in the vicinity of the surface of the substrate 24 as a result of collision of Kr* thus excited and oxygen molecules. By processing the surface of the substrate by the atomic state oxygen thus formed, it becomes possible to form a high-quality oxide film suitable for a gate insulation film not only on the (100) surface of the silicon substrate but also on the (111) surface and the (110) surface.

Figure 3:
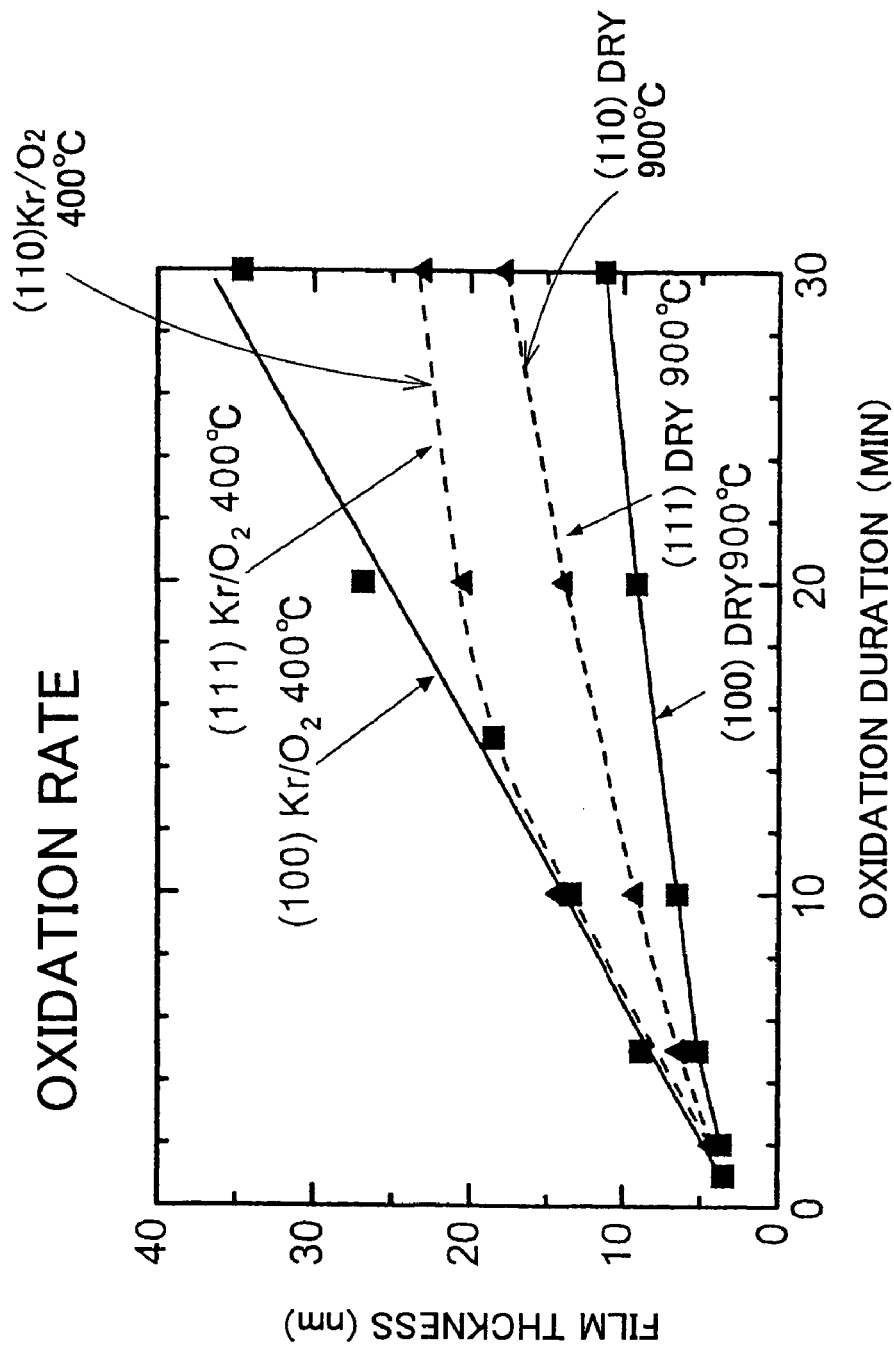
FIG. 3 is a diagram showing oxidation processing of a silicon substrate conducted by using the substrate processing apparatus of FIG. 2.

FIG. 3 shows the growth rate of the Kr/O$_2$ plasma oxide film formed on the (100) surface, (111) surface and (110) surface of a silicon substrate by using the microwave substrate processing apparatus 20 of FIG. 2 in comparison with a growth rate of a thermal oxide film.

Referring to FIG. 3, it can be seen that a far greater growth rate is achieved in the case of the Kr/O$_2$ plasma oxide film as compared with a thermal oxide film, while this clearly indicates that the oxidation of the Si substrate proceeds with very high rate by using highly reactive atomic state oxygen O*. Further, FIG. 3 also indicates that the growth rate becomes smaller in the Kr/O$_2$ plasma oxide film on the (111) surface or (110) surface having a larger surface density of the Si atoms as compared with the case the oxide film is grown on the (100) surface. It should be noted that this result is in agreement with the conclusion predicted from a source supply rate control process, and it is indicated that the plasma oxide film formed as such as excellent film quality.

In the case of forming a thermal oxide film on the (111) surface or (110) surface of the Si substrate, on the other hand, it will be noted that the growth rate becomes larger than the case of forming the thermal oxide film on the (100) surface. This indicates that the thermal oxide film formed on the (111) surface of (110) surface has a poor film quality.

Figure 4:
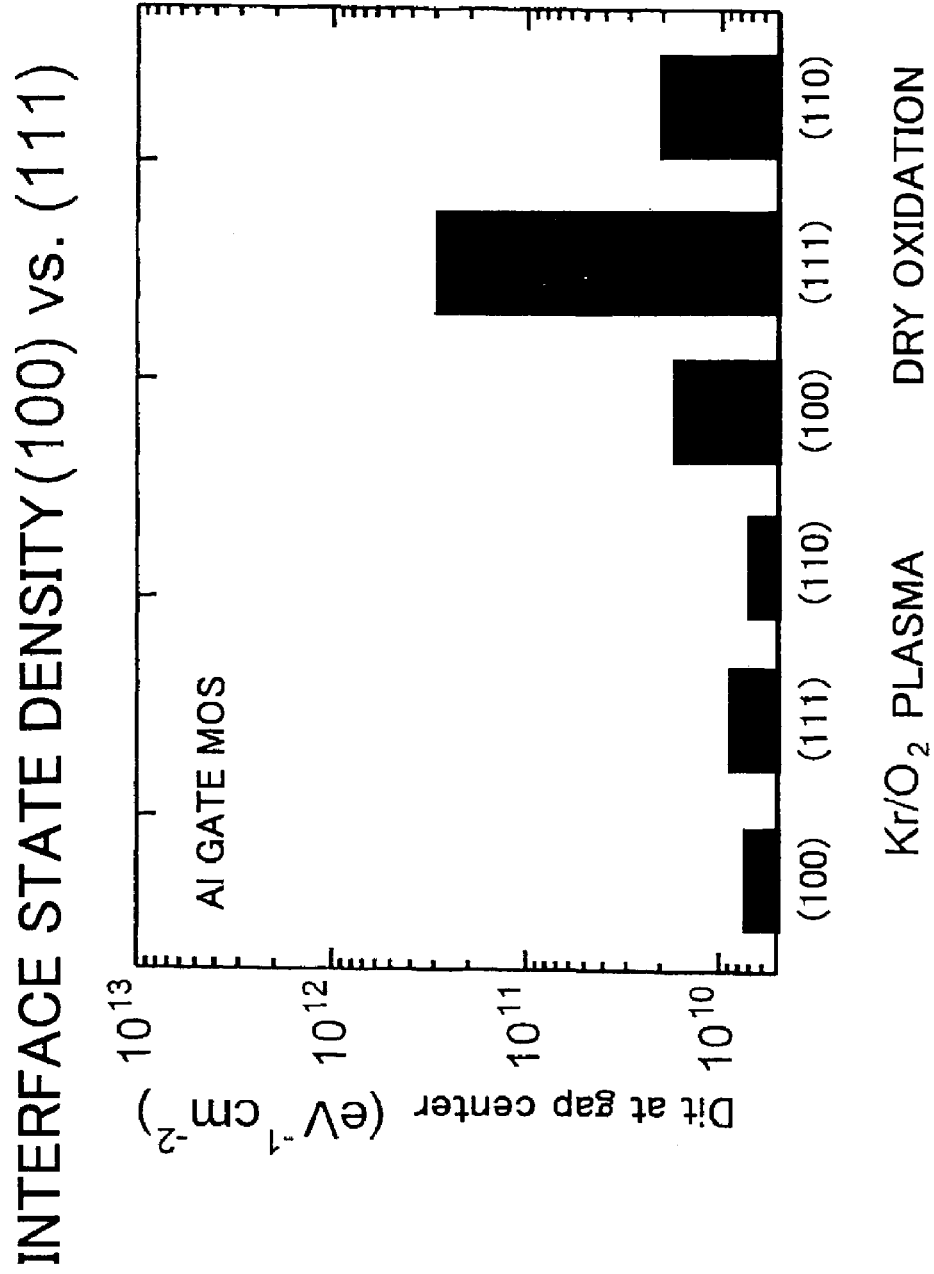
FIG. 4 is a diagram showing the film quality of oxide films formed on various crystal surfaces of silicon while using the substrate processing apparatus of FIG. 2 in comparison with a thermal oxide film.

FIG. 4 shows the result of comparison of the surface state density between the Kr/O$_2$ plasma oxide film thus formed and the thermal oxide film.

Referring to FIG. 4, it can be seen that the Kr/O$_2$ plasma oxide film has a lower interface state density as compared with the thermal oxide film formed on the (100) surface irrespective of the case whether the Kr/O$_2$ plasma oxide film is formed on the (100) surface or (111) surface or (110) surface. Thus, the result of FIG. 4 shows that a very high quality oxide film is obtained in the Kr/O$_2$ plasma oxide film.

In the case of the thermal oxide film formed on the (111) surface or (110) surface of silicon, on the other hand, it can be seen that there is formed a very large interface state density as is predicted from the result of FIG. 3. Thus, the use of such a thermal oxide film for the gate insulation film of a MOS transistor would cause various problems associated with carrier trapping such as variation of threshold voltage, increase of gate leakage current, and the like.

FIGS. 5A–5C show the relationship between a drain voltage and a normalized drain current of a p-channel MOS transistor formed on the (100) surface, (111) surface and the (110) surface of a silicon substrate by using the silicon oxide film formed on these surfaces by the substrate processing apparatus of FIG. 2 for the gate insulation film. In FIGS. 5A and 5B, it should be noted that the case of forming the silicon oxide film by the Kr/O$_2$ plasma process and the case of forming the silicon oxide film by the thermal oxidation process are both represented. In FIG. 5C, on the other hand, only the case of forming the gate oxide film by the Kr/O$_2$ plasma process is shown in view of the fact that no oxide film can be formed on the (110) surface by a thermal oxidation process. It should be noted that the result of FIG. 5A is for the p-channel MOS transistor having a gate length of 10 μm and a gate width of 50 μm, while the results of FIGS. 5B and 5C are for the p-channel MOS transistor having a gate length of 10 μm and a gate width of 300 μm.

Referring to FIGS. 5A–5C, it can be seen that the drain current, and hence the transconductance or current drivability, of the p-channel MOS transistor can be increased by forming the transistor on a crystal surface other than the (100) surface of silicon, such as the (111) surface or (110) surface. In the case the p-channel MOS transistor is formed on the (111) surface, for example, a current drivability of about 1.3 times as large as the current drivability of a p-channel transistor formed on the (100) surface. In the case the p-channel MOS transistor is formed on the (110) surface, a current drivability of about 2.4 times is obtained.

First Embodiment

Figure 6:
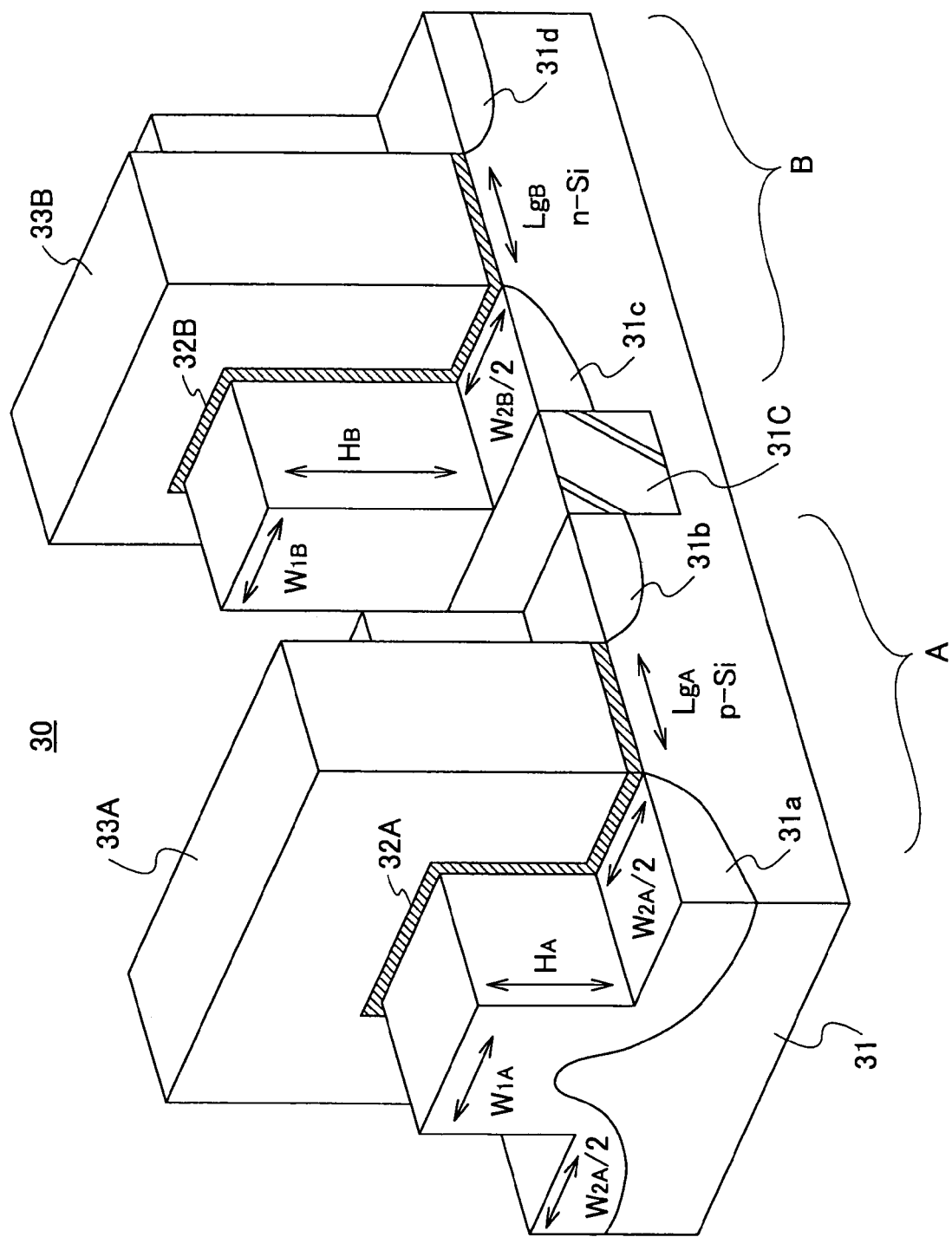
FIG. 6 is a diagram showing the construction of a CMOS device according to a first embodiment of the present invention.
Figure 7:
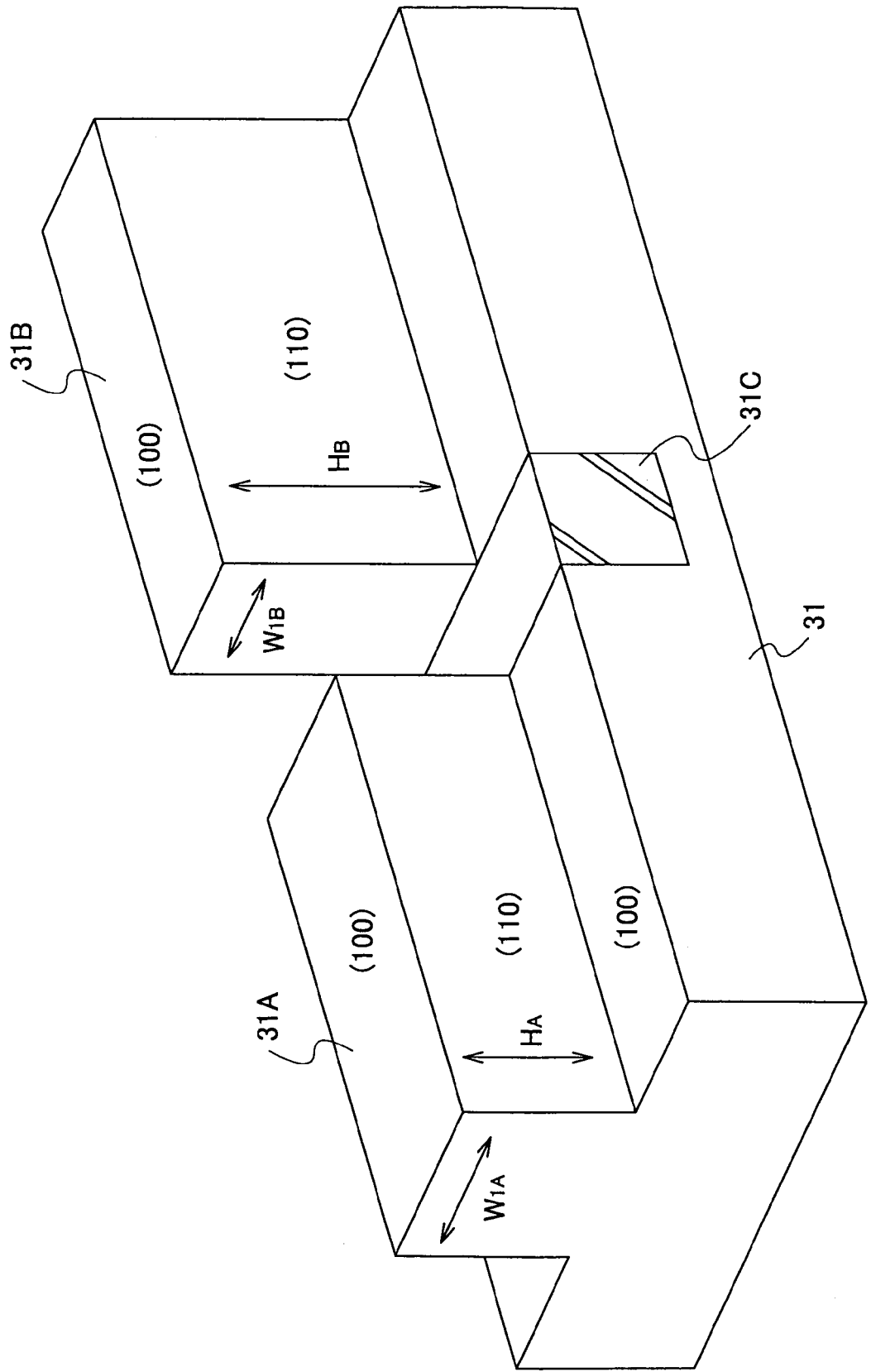
FIG. 7 is a diagram showing a part of the CMOS device of FIG. 6.

FIGS. 6 and 7 show the construction of a CMOS device 30 according to a first embodiment of the present invention, wherein it should be noted that FIG. 7 is a diagram showing a part of FIG. 6.

Referring to FIGS. 6 and 7, the CMOS device 30 is constructed on a Si substrate having a (100) principal surface on which a region A and a region B are formed with a separation from each other by a device isolation region 31C. As represented in FIG. 7, the region A is formed with a projection 31A having a width $W_{1A}$ and a height $H_A$, while the region B is formed with a projection 31B having a width $W_{1B}$ and a height $H_B$ at both lateral sidewalls. As can be seen from FIG. 7, the top surfaces of the projections 31A and 31B are defined by the (100) surface, while the sidewall surfaces thereof are defined by the (110) surface.

On the Si substrate 31 of FIG. 7, a silicon oxide film is formed uniformly by using the substrate processing apparatus 20 explained with reference to FIG. 2, and polysilicon gate electrodes 33A and 33B shown in FIG. 6 are formed further thereon respectively on the region A and on the region B. The foregoing silicon oxide film is patterned with the patterning of the gate electrodes 33A and 33B, and thus, there is formed a gate insulation film 32A in correspondence to the gate electrode 33A and there is formed a gate insulation film 32B in correspondence to the gate electrode 33B.

In the region A of the CMOS device 30 of FIG. 6, there are further formed p-type diffusion regions 31$a$ and 31$b$ at both sides of the gate electrode 33A including the projection 31A, by conducting ion implantation of a p-type impurity while using the gate electrode 33A as a self-alignment mask. Similarly, there are formed n-type diffusion regions 31$c$ and 31$d$ in the region B at both sides of the gate electrode 33B including the projection 31B. As a result, a p-channel MOS transistor is formed on the region A and an n-channel MOS transistor is formed on the region B of the substrate 31.

In the CMOS device of FIG. 6, it should be noted that the p-channel MOS transistor has a gate length $Lg_A$ while the n-channel MOS transistor has a gate length $Lg_B$, and the gate electrode 33A covers the flat part of the Si substrate at respective sides of the projection 31A with a gate width $W_{2A}/2$. As a result, the gate width of the gate electrode 33A on the (100) surface including the top surface of the projection 31A is given by $W_{1A}+W_{2A}$. On the contrary, the gate width $W_A$ of the gate electrode 33A on the (110) surface is given by $2H_A$ in view of the fact that the gate electrode 33A is formed on the both sidewall surfaces. As a result, the current drivability of the p-channel MOS transistor formed on the region A is given by the equation $\mu_{p1}(W_{1A}+W_{2A})+2\mu_{p2}H_A$, wherein $\mu_{p1}$ represents the hole mobility on the (100) surface while $\mu_{p2}$ represents the hole mobility on the (110) surface.

Similarly, the current drivability of the n-channel MOS transistor formed on the region B is given by the equation $\mu_{n1}(W_{1B}+W_{2B})+2\mu_{n2}H_B$, wherein $\mu_{n1}$ represents the electron mobility on the (100) surface while $\mu_{n2}$ represents the electron mobility on the (110) surface.

Thus, in the CMOS device 30 of the present embodiment, in which the p-channel MOS transistor has the sidewall part also on the both sidewall surfaces, the width and the height of the projections 31A and 31B are determined such that the current drivability thereof balances the current drivability of the n-channel MOS transistor and hence the relationship $$\mu_{p1}(W_{1A}+W_{2A})+\mu_{p2}W_A=\mu_{n1}(W_{1B}+W_{2B})+\mu_{n2}W_B$$

wherein it should be noted that the relationship $W_A=2H_A$, $W_B=2H_B$ is used.

In such a construction, in particular, it becomes possible to balance the current drivability of the p-channel MOS transistor and the n-channel MOS transistor by setting the heights $H_A$ and $H_B$ of the projections 31A and 31B while maintaining the same device area.

It should be noted that it is not always necessary to form the transistor on the both sidewall surfaces but it is also possible to form the transistor only on one sidewall surface.

In the description heretofore, it was assumed that the gate insulation films 32A and 32B are formed of a silicon oxide film, while the present invention also allows formation of a silicon nitride film for the gate insulation films 32A and 32B by forming a mixed gas plasma of a rare gas such as an Ar or Kr gas and an $NH_3$ gas or a mixed gas of the rare gas and an $N_2$ gas and a $H_2$ gas in the substrate processing apparatus of FIG. 2. Further, it is possible to form a silicon oxynitride film for the gate insulation films 32A and 32B by adding thereto an $O_2$ gas. In this case, a p-channel MIS transistor and an n-channel MIS transistor are obtained instead of the p-channel MOS transistor and the n-channel MOS transistor.

Further, the substrate 31 is not limited to silicon in the present embodiment. For example, it is possible to use a SiGe substrate in which Si is added with other element such as Ge.

Second Embodiment

Figure 8:
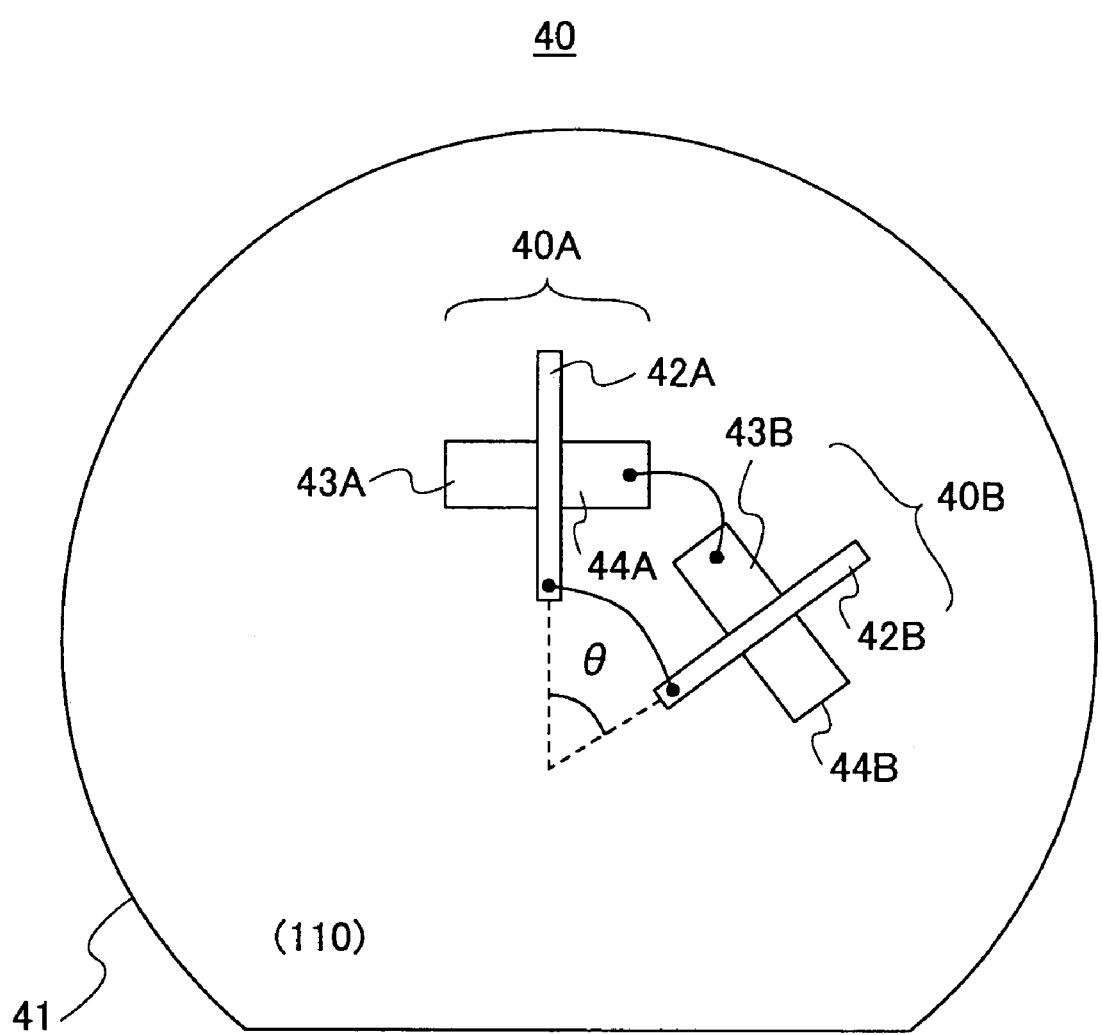
FIG. 8 is a diagram showing the construction of a CMOS device according to a second embodiment of the present invention.

FIG. 8 shows the construction of a CMOS device 40 according to a second embodiment of the present invention.

Referring to FIG. 8, the CMOS device 40 is formed on a Si substrate 41 having a (111) surface or a (110) surface as the principal surface and includes an n-channel MOS transistor 40A having a gate electrode 42A extending on the Si substrate 41 in a first orientation and a p-channel MOS transistor 40B having a gate electrode 42B extending on the Si substrate in a second, different orientation. At both lateral sides of the gate electrode 42A, there are formed n-type diffusion regions 43A and 44A. Similarly, p-type diffusion regions 43B and 44B are formed at both lateral sides of the gate electrode 42B.

Thereby, it should be noted that there is formed a CMOS circuit by connecting the diffusion region 44A and the diffusion region 43B and by connecting the gate electrodes 42A and 42B.

In the CMOS device of such a construction, it should be noted that the current drivability of the p-channel MOS transistor changes with the orientation θ thereof with respect to the p-channel MOS transistor. In the case of the silicon wafer of (110) orientation, the current drivability becomes maximum in the case the direction connecting the source and drain regions of the transistor is oriented in the <111> direction. In the direction rotated by 180°, on the other hand, the current drivability becomes minimum. Further, the current drivability takes an intermediate value between the maximum and the minimum at an intermediate angle. In the case of a p-channel MOS transistor, the ratio of the maximum and the minimum is about 2.5. In the case of an n-channel MOS transistor, on the other hand, the ratio of the maximum and the minimum is about 1.4.

Thus, by optimizing the mutual orientation angle θ, it becomes possible to balance the current drivability of the n-channel MOS transistor 40A and the p-channel MOS transistor 40B.

Third Embodiment

Figure 9:
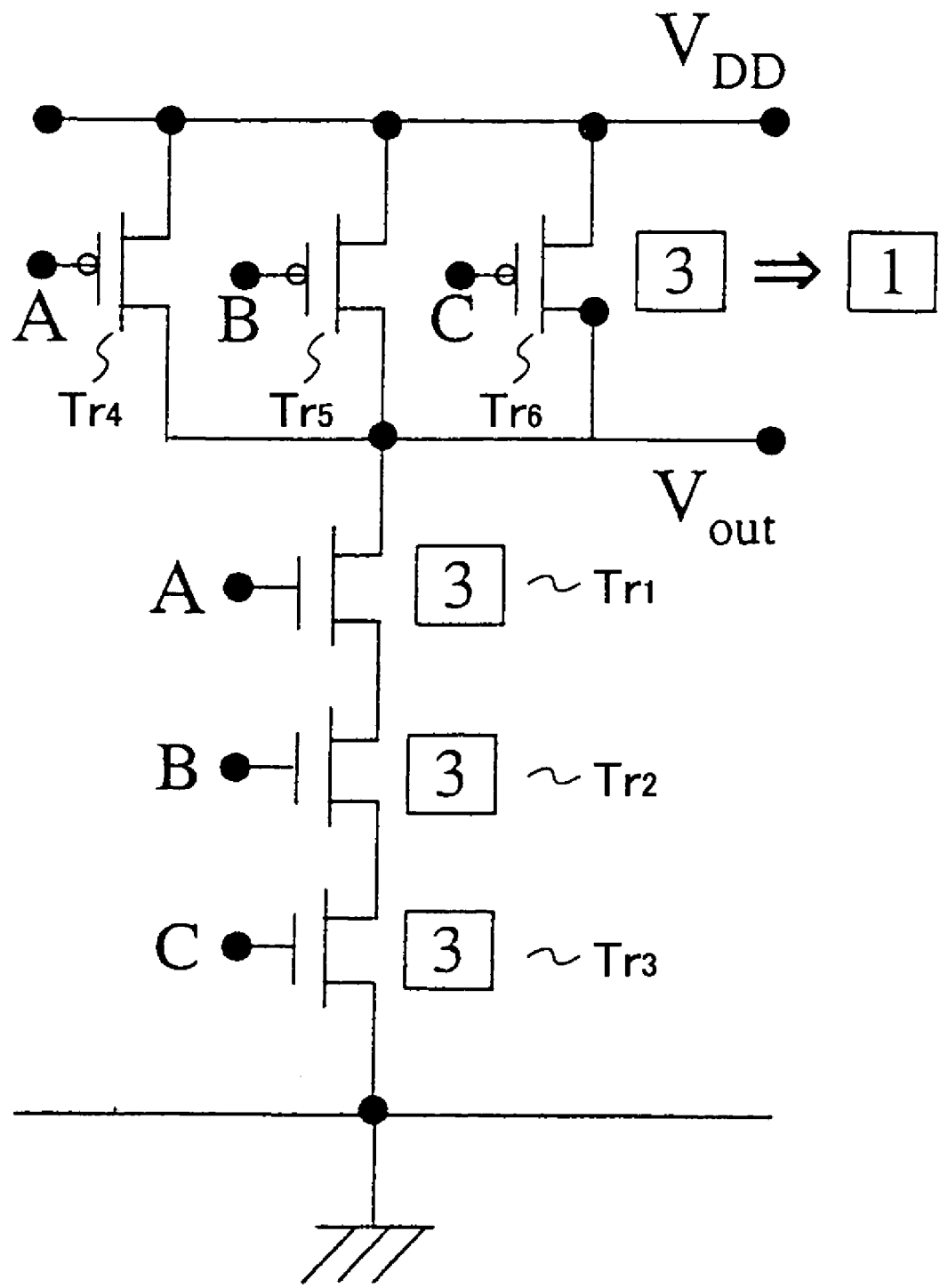
FIG. 9 is a diagram showing the construction of a three-input NAND circuit according to a third embodiment of the present invention.

FIG. 9 shows the construction of a three-input NAND circuit that uses the CMOS circuit of any of the foregoing embodiments.

Referring to FIG. 9, the three-input NAND circuit includes n-channel MOS transistors $Tr_1$–$Tr_3$ connected in series between an output line connected to an output terminal and a ground line, while there are connected p-channel MOS transistors $Tr_4$–$Tr_6$ in parallel between an output line VOUT and a supply voltage source $V_{DD}$. Thereby, an input logic signal A is supplied to respective gates of the MOS transistors $Tr_1$ and $Tr_4$, while another input logic signal B is supplied to respective gates of the MOS transistors $Tr_2$ and $Tr_5$. Further, an input logic signal C is supplied to respective gates of the MOS transistors $Tr_3$ and $Tr_6$.

In FIG. 9, it should be noted that the numerals attached to the transistors indicate the relative device area of the respective transistors. Thus, in the case the entire transistors are formed on the (100) surface of silicon, it will be noted that the illustrated NAND circuit has the relative device area of 18. On the other hand, in the case the current drivability of the p-channel MOS transistor has been increased by three times as a result of the construction of FIG. 6 or FIG. 8, the device area can be decreased to ⅓, and the relative area of the NAND circuit is reduced to 12. As a result of the decrease of the device area, the oscillation frequency of a ring circuit, formed by cascading the NAND circuit for 31 times, is increased from the conventional value of 855 MHz to 879 MHz for the case in which each transistor has a gate length of 0.25 μm.

Fourth Embodiment

Figure 10:
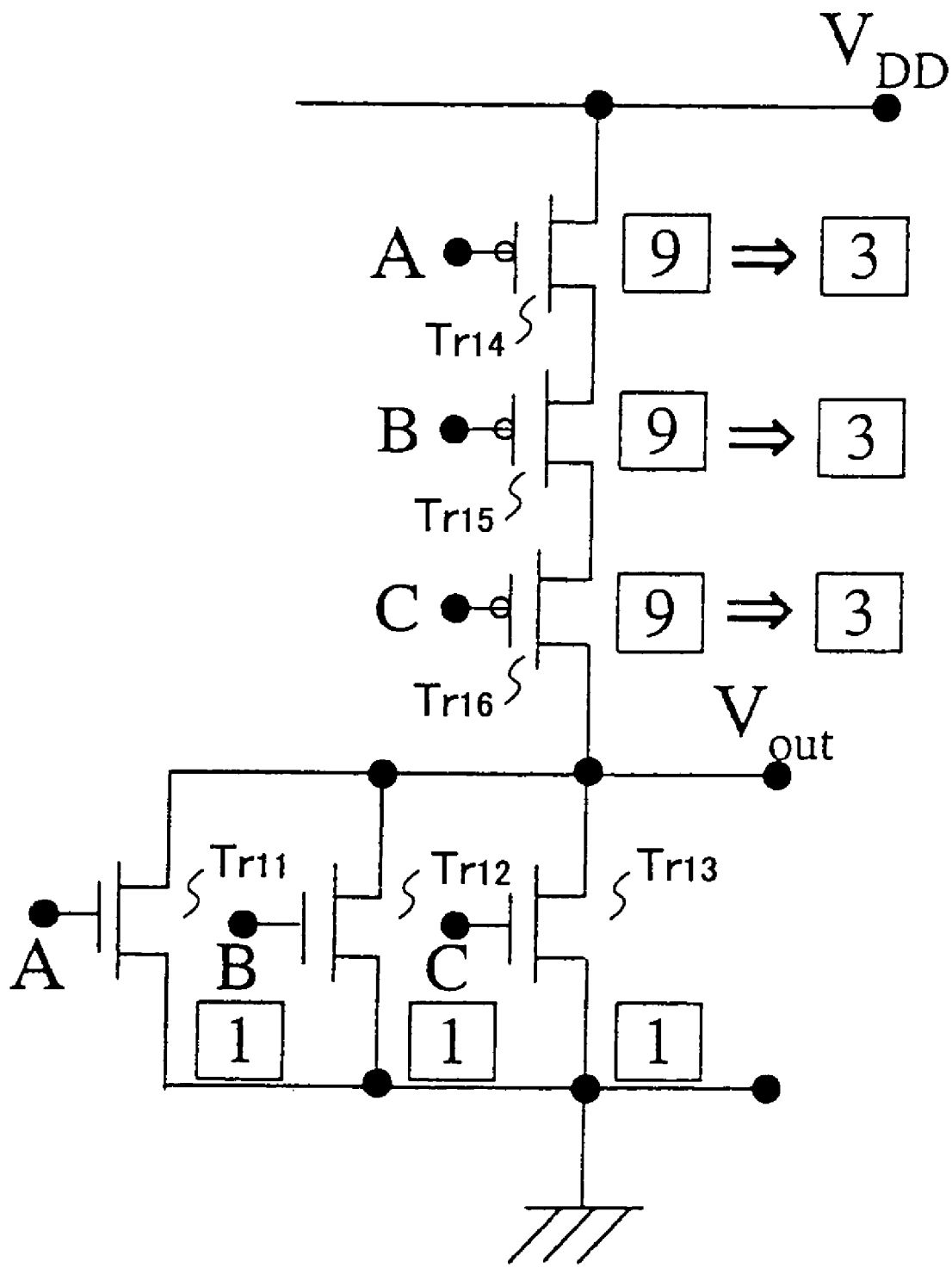
FIG. 10 is a diagram showing the construction of a three-input NAND circuit according to a fourth embodiment of the present invention.

FIG. 10 shows the construction of a three-input NOR circuit that uses the CMOS circuit of any of the preceding embodiments.

Referring to FIG. 10, the three-input NOR circuit includes n-channel MOS transistors $Tr_{11}$–$Tr_{13}$ connected in parallel between an output line connected to an output terminal and a ground line, and p-channel MOS transistors $Tr_{14}$–$Tr_{16}$ are connected in series between the output line VOUT and the supply voltage source $V_{DD}$. Thereby, an input logic signal is supplied to the respective gates of the MOS transistors $Tr_{11}$ and $Tr_{14}$, an input logic signal B is supplied to the respective gates of the MOS transistors $Tr_{12}$ and $Tr_{15}$, and an input logic signal C is supplied to the respective gates of the MOS transistors $Tr_{13}$ and $Tr_{14}$.

In FIG. 10, it should be noted that the numerals attached to respective transistors represent the relative device area of the transistors. Thus, in the case the entire transistors are formed on the (100) surface silicon, the illustrated NOR circuit has the relative device area of 30. On the other hand, when the current drivability of the p-channel MOS transistors $Tr_4$–$Tr_6$ has increased by three times as a result of the construction of FIG. 6 or FIG. 8, the necessary device area is reduced to ⅓, and the relative device area of the NOR circuit is reduced to 12. As a result of such a decrease of the device area, the ring oscillator, formed by cascading the NOR circuit 31 for 31 stages, shows an increase of the oscillation frequency from the conventional value of 447 MHz to 879 MHz, provided that each transistor has the gate length of 0.25 μm.

Fifth Embodiment

Figure 11:
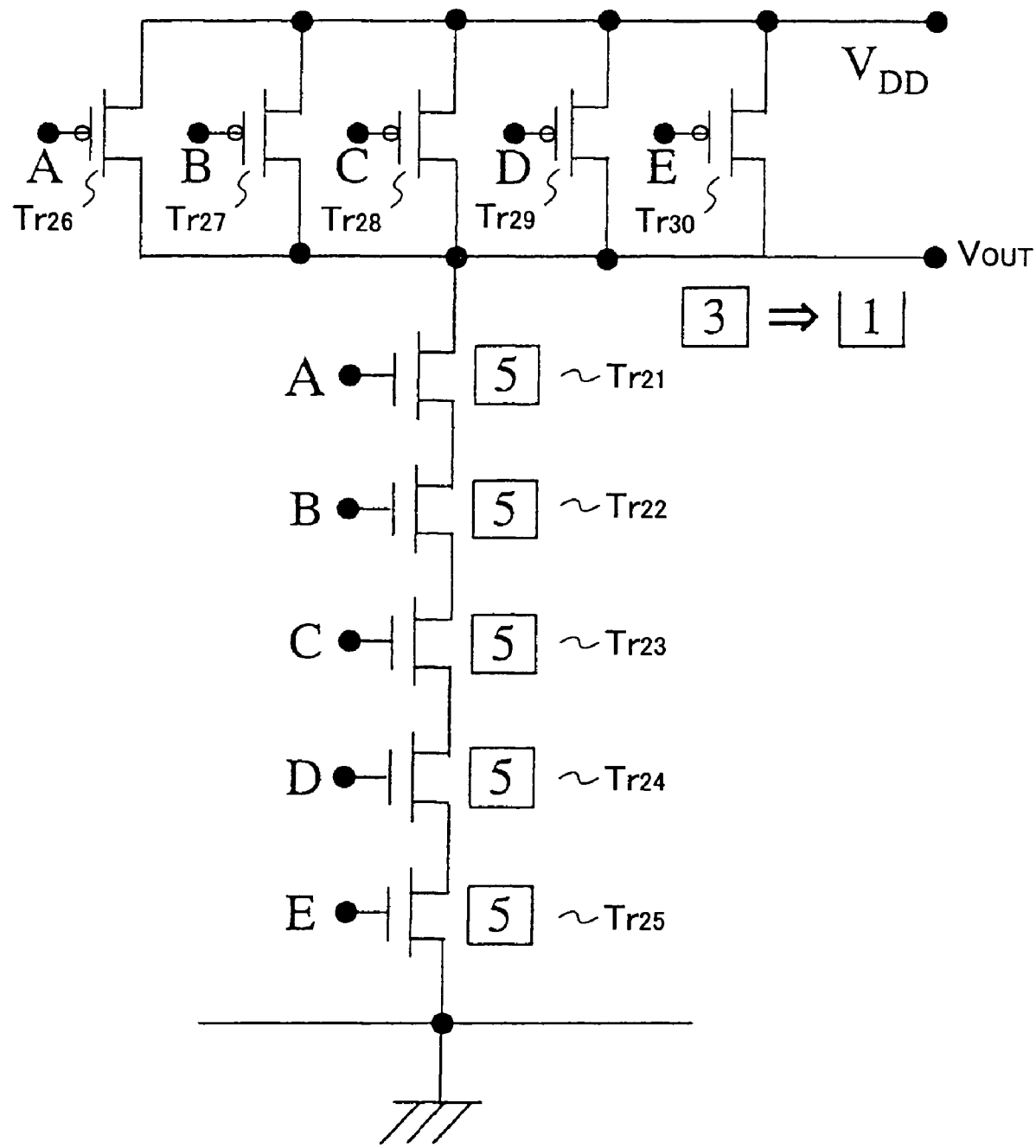
FIG. 11 is a diagram showing the construction of a five-input NAND circuit according to a fifth embodiment of the present invention.

FIG. 11 shows the construction of a five-input NAND circuit that uses the CMOS circuit of any of the preceding embodiments.

Referring to FIG. 11, the 5-input NAND circuit includes n-channel MOS transistors Tr21–Tr25 connected in series between an output line connected to an output terminal and a ground line, and p-channel MOS transistors Tr26–Tr30 are connected in parallel between the output line VOUT and the supply voltage source $V_{DD}$. Thereby, an input logic signal A is supplied to the respective gates of the MOS transistors $Tr_{21}$ and $Tr_{26}$, an input logic signal B is supplied to respective gates of the MOS transistors $Tr_{22}$ and $Tr_{27}$, an input logic signal C is supplied to respective gates of the MOS transistors $Tr_{23}$ and $Tr_{28}$, an input logic signal D is supplied to respective gates of the MOS transistors $Tr_{24}$ and $Tr_{29}$, and an input logic signal E is supplied to respective gates of the MOS transistors $Tr_{25}$ and $Tr_{30}$.

In FIG. 11, it should be noted that the numerals attached to the respective transistors represent the relative device area of the transistors. Thus, in the case the entire transistors are formed on the (100) surface of silicon, the NAND circuit has a relative area of 40. On the other hand, in the event the current drivability of the p-channel MOS transistors $Tr_{26}$–$Tr_{30}$ are increase by three times as a result of the construction of FIG. 6 or FIG. 8, the necessary device area is decreased to ⅓, and the relative area of the NAND circuit is reduced to 30.

Sixth Embodiment

Figure 12:
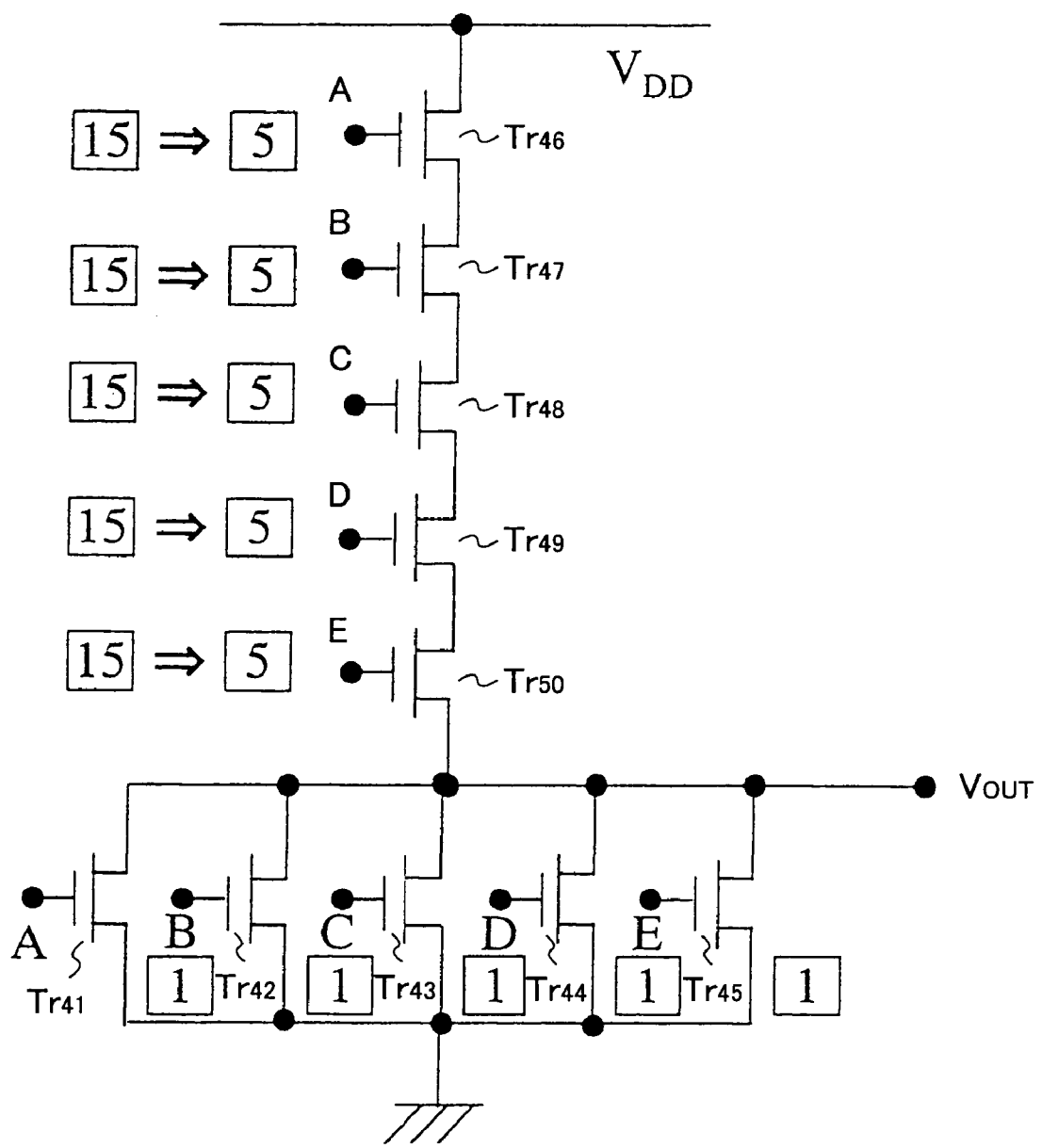
FIG. 12 is a diagram showing the construction of a 5-input NAND circuit according to a sixth embodiment of the present invention.

FIG. 12 shows the construction of a five-input NOR circuit that uses the CMOS circuit of any of the proceeding embodiments.

Referring to FIG. 12, the five-input NOR circuit includes n-channel MOS transistors Tr41–Tr45 connected parallel between an output line connected to an output terminal and a ground line, and p-channel MOS transistors $Tr_{46}$–$Tr_{50}$ are connected in series between the output line VOUT and a supply voltage source $V_{DD}$. Thereby, an input logic signal A is supplied to respective gates of the MOS transistors $Tr_{41}$ and $Tr_{46}$, an input logic signal B is supplied to the respective gates of the transistors $Tr_{42}$ and $Tr_{47}$, an input logic signal C is supplied to the respective gates of the transistors $Tr_{43}$ and $Tr_{48}$, an input logic signal D is supplied to the respective gates of the transistors $Tr_{44}$ and $Tr_{49}$, and an input logic signal E is supplied to the respective gates of the transistors $Tr_{45}$ and $Tr_{50}$.

It should be noted that the numerals attached to the transistors of FIG. 12 indicate the relative device area of the respective transistors. Thus, in the event the entire transistors are formed on the (100) surface of silicon, the NOR circuit has an overall relative area of 80. In the case the current drivability of the p-channel MOS transistors $Tr_{46}$–$Tr_{50}$ has increased three times as a result of the construction of FIG. 6 or FIG. 8, the necessary device are is decreased to ⅓, and the relative area of the NOR circuit is reduced to 30. As a result of such a decrease of the device area, the ring oscillator, formed by cascading the NOR circuit for 31 stages shows an increase of the oscillation frequency from the conventional value of 207 NHz to 431 MHz for the case each transistor ahs the gate length of 0.25 μm.

Seventh Embodiment

Figure 13:
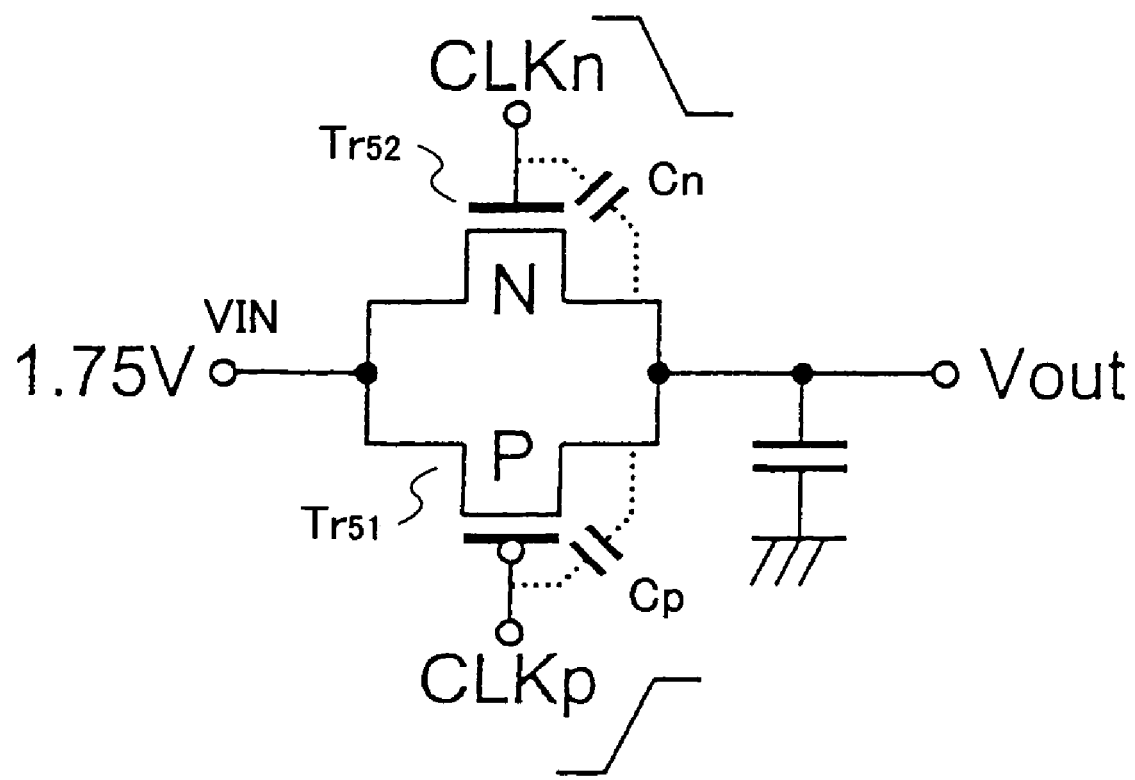
FIG. 13 is a diagram showing the construction of a CMOS switch according to a seventh embodiment of the present invention.

FIG. 13 shows the construction of a CMOS switch according to a seventh embodiment of the present invention.

Referring to FIG. 13, the CMOS switch is formed of a p-channel MOS transistor $Tr_{51}$ and an n-channel MOS transistor $Tr_{52}$ connected parallel between an input terminal $V_{IN}$ and an output terminal $V_{OUT}$, and causes sampling of the signal supplied to the input terminal $V_{IN}$ in response to the clock signals CLKp and CLKn supplied to the respective gate electrodes.

Figure 14A:
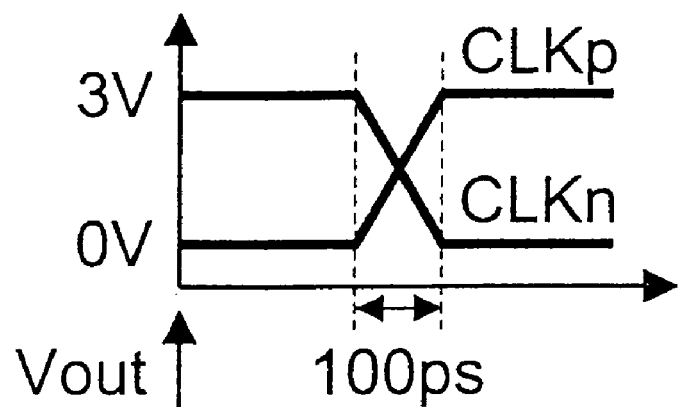
FIGS. 14A–14C are diagrams explaining the operation of the CMOS switch of FIG. 13.
Figure 14B:
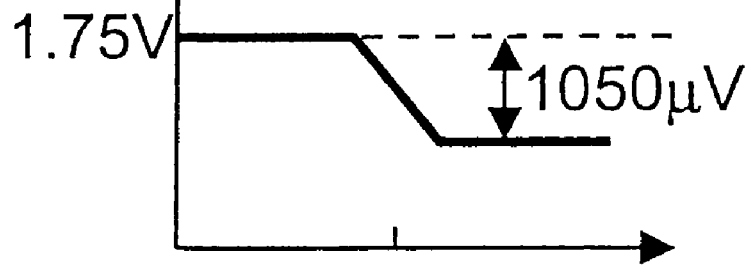

FIG. 14A shows the waveform of the clock signals CLKp and CLKn, while FIG. 14B shows the waveform of the output signal obtained at the output terminal $V_{OUT}$ for the case a conventional p-channel MOS transistor and a conventional n-channel MOS transistor formed on the (100) surface of the silicon substrate is used for the CMOS switch.

Referring to FIGS. 14A and 14B, it can be seen that the conduction of the n-channel MOS transistor Tr52 and the conduction of the p-channel MOS transistor Tr51 is disconnected in response to occurrence of transition in the clock signals CLKp and CLKn. On the other hand, the conventional p-channel MOS transistor $Tr_{51}$ has a larger parasitic capacitance, associated with the large device area thereof, as compared with the n-channel MOS transistor $Tr_{52}$, and because of this, there is caused a large drop of output voltage.

Figure 14C:
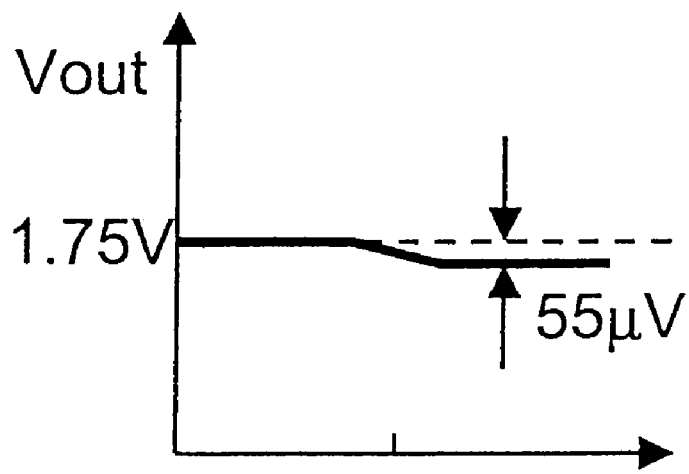

On the contrary to this, FIG. 14C shows the output waveform of the CMOS switch that uses the CMOS device of the present invention. In this case, the parasitic capacitance Cp of the p-channel MOS transistor $Tr_{51}$ is reduced to the value comparable to the parasitic capacitance Cn of the n-channel MOS transistor $Tr_{52}$, and the offset of the output voltage is decreased significantly.

Thus, by using the CMOS device of the present invention, a CMOS switch having an excellent response speed is realized.

Eighth Embodiment

Figure 15:
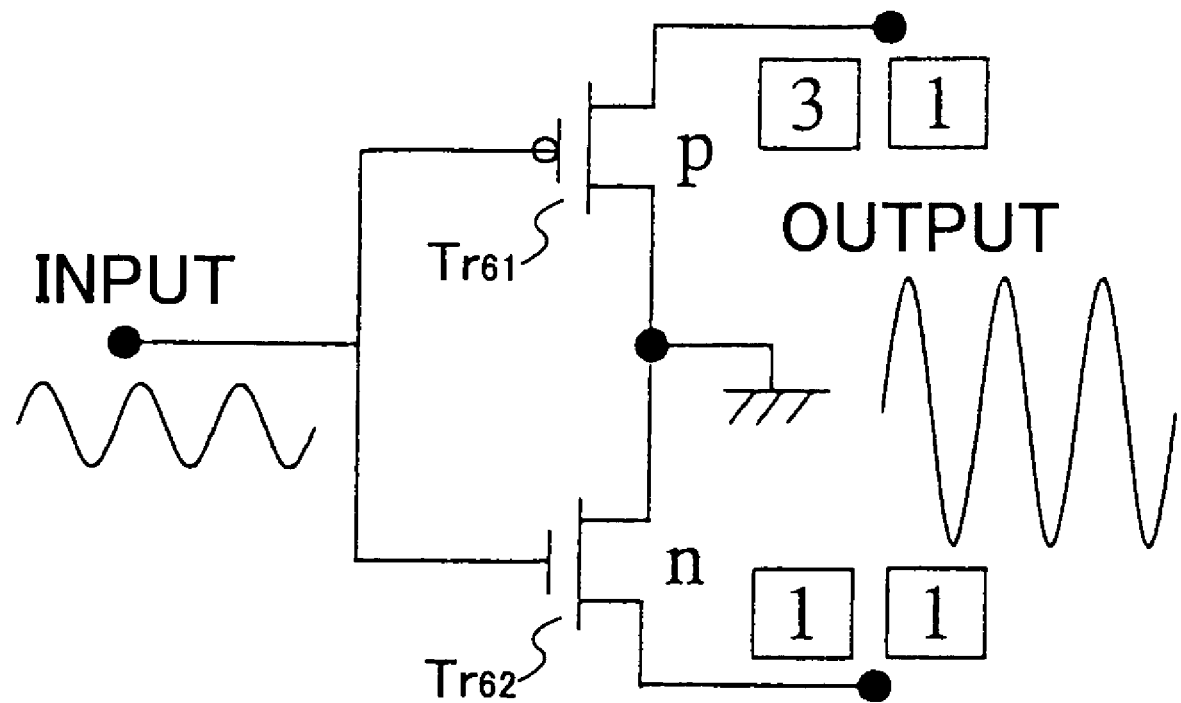
FIG. 15 is a diagram showing the construction of a push-pull amplifier according to an eighth embodiment of the present invention.

FIG. 15 shows the construction of a B-class push-pull amplifier according to an eight embodiment of the present invention that uses a p-channel MOS transistor $Tr_{61}$ and an n-channel MOS transistor $Tr_{62}$.

Referring to FIG. 15, the operational characteristics and the parasitic device characteristics are balanced in the B-class push-pull amplifier of the present embodiment between the p-channel MOS transistor Tr61 and the n-channel MOS transistor Tr62, and it becomes possible to realize amplification free from harmonic distortion over wide dynamic range and frequency range.

Further, the present invention is not limited to the embodiments described heretofore, but various variations and modifications may be made without departing from the scope of the invention recited in the claims.

INDUSTRIAL APPLICABILITY

According to the present invention, it becomes possible to balance the current drivability of a p-channel MOS transistor and an n-channel MOS transistor by using a crystal surface other than the (100) surface of silicon. Thereby, miniaturization of the CMOS device is facilitated and the operational speed is improved.

The invention claimed is:

1. A complementary MIS device, characterized by:
   a semiconductor substrate having a first crystal surface as a principal surface, said semiconductor substrate being defined with a p-channel MIS transistor region and an n-channel MIS transistor region;
   a p-channel MIS transistor comprising: a first semiconductor structure formed in said p-channel MIS transistor region as a part of said semiconductor substrate and formed of a pair of sidewall surfaces defined by a second crystal surface different from said first crystal surface and a top surface defined by a third crystal surface different from said second crystal surface; a first gate insulation film formed on said p-channel MIS transistor region so as to cover said principal surface and said sidewall surfaces and said top surface of said first semiconductor structure with a substantially uniform thickness; a first gate electrode formed on said p-channel MIS transistor region so as to cover said principal surface and said sidewall surfaces and said top surface of said first semiconductor structure continuously via said first gate insulation film; and first and second p-type diffusion regions formed in said semiconductor substrate and said first semiconductor structure in said p-channel MIS transistor region at a first side and an opposite side of said first gate electrode, each of said first and second p-type diffusion regions extending continuously along said principal surface of said semiconductor substrate and said sidewall surfaces and said top surface of said first semiconductor structure;
   an n-channel MIS transistor comprising: a second semiconductor structure formed in said n-channel MIS transistor region as a part of said semiconductor substrate and formed of a pair of sidewall surfaces defined by a fourth crystal surface different from said first crystal surface and a top surface defined by a fifth crystal surface different from said fourth crystal surface; a second gate insulation film formed on said n-channel MIS transistor region so as to cover said principal surface and said sidewall surfaces and said top surface of said second semiconductor structure with a substantially uniform thickness; a second gate electrode formed on said n-channel MIS transistor region so as to cover said principal surface and said sidewall surfaces and said top surface of said second semiconductor structure continuously via said second gate insulation film; and first and second n-type diffusion regions formed in said semiconductor substrate and said second semiconductor structure in said n-channel MIS transistor region at a first side and an opposite side of said second gate electrode, each of said first and second n-type diffusion regions extending continuously along said principal surface of said semiconductor substrate and said sidewall surfaces and said top surface of said second semiconductor structure;
   a width of said top surface and said sidewall surfaces of said first semiconductor structure and a width of said top surface and said sidewall surfaces of said second semiconductor structure being set such that a current drivability of said p-channel MIS transistor balances substantially with a current drivability of said n-channel MIS transistor.

2. A complementary MIS device as claimed in claim 1, wherein said first crystal surface, said third crystal surface, and said fifth crystal surface are formed of an identical crystal surface, and wherein said second crystal surface and said fourth crystal surface are formed of an identical crystal surface.

3. A complementary MIS device as claimed in claim 2, wherein said width of said top surface and sidewall surfaces of said first semiconductor structure and said width of said top surface and sidewall surfaces of said second semiconductor structure are determined so as to satisfy the relationship $$\mu_{p1}(W_{1A}+W_{2A})+\mu_{p2}W_A=\mu_{n1}(W_{1B}+W_{2B})+\mu_{n2}W_B,$$

wherein $W_{1A}$ and $W_A$ represent respectively the widths of the top surface and the sidewall surfaces of the first semiconductor structure, $W_{1B}$ and $W_B$ represent respectively the widths of the top surface and the sidewall surfaces of the second semiconductor structure, $W_{2A}$ represents a gate width of the first gate electrode on said principal surface, $W_{2B}$ represents a gate width of the second gate electrode on said principal surface, $\mu_{p1}$ represents a hole mobility on said first crystal surface, $\mu_{p2}$ represents a hole mobility on said second crystal surface, $\mu_{n1}$ represents an electron mobility on said first crystal surface, and $\mu_{n2}$ represents an electron mobility on said second crystal surface.

4. A complementary MIS device as claimed in claim 2 or 3, wherein said first crystal surface comprises a (100) surface of silicon or a crystal surface in the vicinity thereof, and wherein said second crystal surface comprises a (110) surface of silicon or a crystal surface in the vicinity thereof.

5. A complementary MIS device as claimed in any of claims 1–3, wherein said first and second gate insulation films comprise any of an oxide film, a nitride film, or an oxynitride film.

6. A complementary MIS device as claimed in claim 4, wherein said first and second gate insulation films comprise any of an oxide film, a nitride film, or an oxynitride film.

7. A complementary MIS device as claimed in any of claims 1–3, wherein said p-channel MIS transistor and said n-channel MIS transistor have substantially the same device area.

8. A complementary MIS device, characterized by
   a semiconductor substrate having a first crystal surface as a principal surface, said semiconductor substrate being defined with a p-channel MIS transistor region and an n-channel MIS transistor region;
   a p-channel MIS transistor comprising: a first semiconductor structure formed in said p-channel MIS transistor region as a part of said semiconductor substrate and including a sidewall surface defined by a second crystal surface different from said first crystal surface and a top surface defined by a third crystal surface different from said second crystal surface; a first gate insulation film formed on said p-channel MIS transistor region so as to cover said top surface and said sidewall surface of said first semiconductor structure and a portion of said principal surface; a first gate electrode formed on said p-channel MIS transistor region so as to cover said top surface and said sidewall surface of said first semiconductor structure and said portion of said principal surface via said first gate insulation film; and first and second p-type region formed in said semiconductor substrate and said first semiconductor structure at a first side and an opposite side of said first gate insulation film;
   an n-channel MIS transistor comprising: a second semiconductor structure formed in said n-channel MIS transistor region as a part of said semiconductor substrate and including a sidewall surface defined by a fourth crystal surface different from said first crystal surface and a top surface defined by a fifth crystal surface different from said fourth crystal surface; a second gate insulation film formed on said n-channel MIS transistor region so as to cover said top surface and said sidewall surface of said second semiconductor structure and another portion of said principal surface; a second gate electrode formed on said n-channel MIS transistor region so as to cover said top surface and said sidewall surface of said second semiconductor structure and said other portion of said principal surface via said second gate insulation film; and first and second n-type region formed in said semiconductor substrate and said second semiconductor structure at a first side and an opposite side of said second gate insulation film;

a width of said top surface and sidewall surface of said first semiconductor structure and a width of said top surface and sidewall surface of said second semiconductor structure being set such that a current drivability of said p-channel MIS transistor balances substantially with a current drivability of said n-channel MIS transistor.

* * * * *

UNITED STATES PATENT AND TRADEMARK OFFICE
CERTIFICATE OF CORRECTION

PATENT NO. : 7,202,534 B2  Page 1 of 1
APPLICATION NO. : 10/467797
DATED : April 10, 2007
INVENTOR(S) : Tadahiro Ohmi et al.

It is certified that error appears in the above-identified patent and that said Letters Patent is hereby corrected as shown below:

On the title page, item (75), lines 1-5, "Tadahiro Ohmi, c/o Management of Science & Technology Graduate School of Engineering Tohoku University, 05, Aza-Aoba, Aramaki, Aoba-Ku, Sendai-Shi, Miyagi 980-8579 (JP);" should read --Tadahiro Ohmi, 1-17-301, Komegafukuro 2-Chome, Aoba-Ku, Sendai-Shi, Miyagi 980-0813 (JP);--.

Signed and Sealed this

Twenty-second Day of May, 2007

JON W. DUDAS
*Director of the United States Patent and Trademark Office*